United States Patent
Backhausen et al.

(10) Patent No.: US 8,913,435 B2
(45) Date of Patent: Dec. 16, 2014

(54) METHOD AND DEVICE FOR PROGRAMMING DATA INTO NON-VOLATILE MEMORIES

(75) Inventors: Ulrich Backhausen, Taufkirchen (DE); Thomas Kern, Munich (DE); Joerg Syassen, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 264 days.

(21) Appl. No.: 13/233,292

(22) Filed: Sep. 15, 2011

(65) Prior Publication Data

US 2012/0069673 A1  Mar. 22, 2012

(30) Foreign Application Priority Data

Sep. 16, 2010 (DE) .......................... 10 2010 045 581

(51) Int. Cl.
*G11C 16/30* (2006.01)
*G11C 16/10* (2006.01)

(52) U.S. Cl.
CPC ..................................... *G11C 16/10* (2013.01)
USPC ..................................................... 365/185.23

(58) Field of Classification Search
USPC ...................................................... 365/185.23
See application file for complete search history.

(56) References Cited

U.S. PATENT DOCUMENTS

| | | | |
|---|---|---|---|
| 6,822,899 B1* | 11/2004 | Boulos et al. | 365/185.09 |
| 7,558,107 B2* | 7/2009 | Sakurai et al. | 365/185.02 |
| 2006/0181926 A1* | 8/2006 | Ema | 365/185.18 |
| 2008/0029293 A1 | 2/2008 | Ooyabu et al. | |
| 2009/0147573 A1* | 6/2009 | Hemink | 365/185.03 |
| 2009/0250746 A1* | 10/2009 | Kim | 257/324 |
| 2009/0285008 A1* | 11/2009 | Jeong et al. | 365/148 |
| 2010/0149880 A1* | 6/2010 | Chen et al. | 365/185.29 |
| 2012/0151241 A1* | 6/2012 | Kursula | 713/340 |

FOREIGN PATENT DOCUMENTS

DE    102008044405 A1    8/2009

* cited by examiner

*Primary Examiner* — Huan Hoang
*Assistant Examiner* — Min Huang
(74) *Attorney, Agent, or Firm* — Eschweiler & Associates, LLC

(57) ABSTRACT

A device includes a non-volatile memory and a control unit, wherein the control unit is configured to change over programming of data of the non-volatile memory from a first programming mode to a second, different programming mode based on the occurrence of a control signal.

23 Claims, 2 Drawing Sheets

METHOD AND DEVICE FOR PROGRAMMING DATA INTO NON-VOLATILE MEMORIES

RELATED APPLICATION

This application claims priority to German Application Number 102010045581.4 filed Sep. 16, 2010.

FIELD

The present invention relates to the programming of data into non-volatile memories.

BACKGROUND

Non-volatile memories such as, for example, flash memories, EPROM, EEPROM, etc., are nowadays used very often for storing data. By way of example, in data processing units, communication devices and monitoring or control units such as e.g. for monitoring and controlling means of transport such as automobiles, trains, etc., data are constantly generated and stored in the non-volatile memories.

Non-volatile memories very often have memory cells comprising field effect transistors such as MOS transistors, for example, which, in addition to a control gate, have a floating gate in order to store charges there. A floating gate is typically understood to mean a region that can take up free charge carriers, i.e. electrical charges, and is electrically isolated from all other electrically conductive regions by an oxide. In this case, the presence or absence of charges on the floating gate corresponds to the stored data value having a logic state 1 or 0, respectively. The charges can be brought to the floating gate in the case of a programming pulse for example by a corresponding voltage being applied to the control gate by means of a hot charge carrier effect or a Fowler-Nordheim tunneling effect. The charges stored in the floating gate remain on the gate without a further supply of energy, but the quantity of charge is reduced with time as a result of a low discharge rate of charges. Therefore, for the permanent programming of data, it is necessary to bring a corresponding minimum quantity of charges to the floating gate. It is typically required, for example, that data of non-volatile memories have a minimum data retention time. Different values can be provided for the minimum data retention time depending on the type of memory or use, for example 5 years for data, 20 years for program codes. In order to comply with this, after a programming pulse, a check is carried out with regard to the applied charge, for example by the threshold voltage of a memory cell being checked. Upon an insufficient quantity of charge being ascertained, the programming pulse is repeated once or a plurality of times.

SUMMARY

The present invention is directed to an improved concept for programming non-volatile memories.

A method comprises programming data into a non-volatile memory with a first programming mode, generating a control signal, and changing over to a second programming mode depending on the occurrence of the control signal.

Furthermore, a device comprises a non-volatile memory and a control unit, wherein the control unit is configured to change over programming of data of the non-volatile memory from a first programming mode to a second programming mode on the basis of the occurrence of a control signal.

The memory cell of the non-volatile memory can be, for example, a field effect transistor with a floating gate, such as, for example, a MOS-FET with a floating gate, for storing information. In exemplary embodiments, the non-volatile memory is a flash memory.

In one embodiment, programming in the second programming mode has a shorter programming time and a shorter data retention time in comparison with the first programming load.

Furthermore, programming in the second programming mode can be effected with a smaller number of programming pulses and/or a higher programming voltage, compared with the first programming mode.

In one embodiment, in the first programming mode, the programming of the memory cells can be checked and, if appropriate, individual memory cells can be reprogrammed, wherein, in the second programming mode, programming is effected without checking and reprogramming.

The first programming mode can be a programming mode in which, for programming or writing a data value into a memory cell, a programming pulse can be repeated one or a plurality of times. The repetition of a programming pulse is carried out in the first programming mode if one or a plurality of the programmed memory cells were not programmed well enough to fulfill the predefined data retention time. The second programming mode is a programming mode in which, for programming a data value, a programming pulse is carried out only once. In one exemplary embodiment, in the second programming mode, checking the charge state or checking the data retention time and applying a renewed programming pulse in the case of insufficient programming are dispensed with. Since the data are programmed or written sequentially, data can be programmed into the non-volatile memory significantly faster or a data programming rate or data writing rate can be increased.

In one embodiment, an erase operation (ERASE) for erasing memory cells of the memory is terminated upon occurrence of the control signal, wherein the erase operation is not started again in the second programming mode. Typically, the non-volatile memory has an instantaneously active and an instantaneously non-active memory, wherein the non-active memory comprises older data. In this case, the erase operation is effected on the instantaneously non-active sector in order to create space for new data. To put it another way, in these exemplary embodiments, an erase operation on the instantaneously non-active sector is interrupted on the basis of the occurrence of the control signal.

In one embodiment, output signals of at least one sensor element are monitored and, depending on the monitored output signals, it is determined whether a first state is present. The control signal is generated on the basis of the determination that the first state is present. The first state can be an emergency state, for example, i.e. for example indicating a state of a crash of a means of transport. The sensor element can be, for example, a sensor element for determining the occurrence of a collision or crash.

In one embodiment, a further control signal is generated if, for example, the occurrence of the first state was determined mistakenly. A change is therefore made to the first programming mode again, depending on the occurrence of the further control signal, wherein the data written to memory cells in the second programming mode are marked as invalidly written data, depending on the occurrence of the further control signal.

In one embodiment, the data values of the data written to memory cells in the second programming mode are programmed anew after the changeover to the first programming mode. This ensures that the data programmed in the second programming mode, which have a shorter data retention time than data programmed in the first programming mode, are not used further. Since, after the changeover to the first programming mode, it is assumed that programmed data have the higher data retention time corresponding to the first programming mode, a further use of the data programmed in the second programming mode without renewed programming would have the consequence of said data being lost with high probability before the data retention time corresponding to the first programming mode elapses. The data integrity would no longer be ensured, which is avoided by means of the renewed programming in the first programming mode.

Furthermore, if an erase operation for erasing memory cells was previously terminated upon the occurrence of one control signal, the interrupted erase operation for erasing memory cells can be carried out anew on the basis of the occurrence of the further control signal.

BRIEF DESCRIPTION OF THE DRAWINGS

Further embodiments and developments are the subject matter of the dependent claims or are explained in the following detailed description with reference to the accompanying drawings, in which

DETAILED DESCRIPTION

Figure 1:
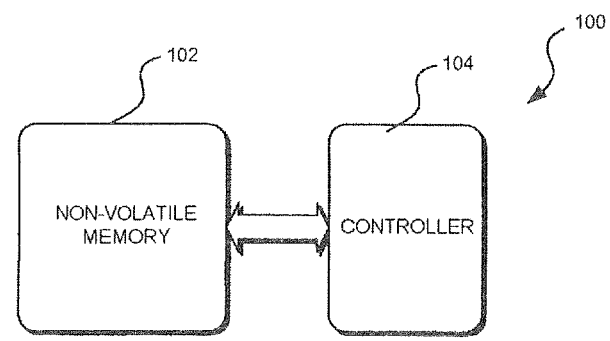
FIG. 1 shows a schematic illustration of a device in accordance with one embodiment.

Referring to FIG. 1, an explanation will now be given of an embodiment with a device 100 comprising a non-volatile memory 102 and a control unit or controller 104. The non-volatile memory 102 can have memory cells comprising field effect transistors as a data-storing unit. In one embodiment, the non-volatile memory 102 is a flash memory. As already mentioned above, flash memories are memories that can store information by the programming of field effect transistors with a floating gate. Field effect transistors with a floating gate typically have one or a plurality of high-voltage pumps in order to generate the voltages required for programming. The programming of a flash memory can be effected for example proceeding from an erased state (erase state) in which all the cells have a logic zero. It goes without saying, however, that, in other embodiments, programming can be effected proceeding from an erased state in which all the cells have a logic one. The non-volatile memory 102 can be subdivided into one or a plurality of blocks, that can in turn be divided into a plurality of subunits, for example pages, sectors or blocks. Typically, in a flash memory, programming is carried out for an entire page and an erase operation is carried out for an entire block or sector.

The control unit 104 is configured to control the non-volatile memory 102. The control unit 104 can furthermore also provide even further functions that can relate to the non-volatile memory 102 or can also lie outside the non-volatile memory 102. The control unit 104 can be composed of a plurality of units that can furthermore also be spatially separated from one another. In one embodiment, the control unit 104 can have one or a plurality of interfaces with corresponding functionalities.

The control unit 104 can be programmable or partly programmable by means of software or firmware or be embodied purely in terms of hardware, for example in the form of a state machine. In one embodiment, the control unit 104 can have one or a plurality of registers for storing information.

The control unit 104 can be configured to generate electrical voltages and/or currents for erasing memory cells, programming data into the memory cells or reading out data. The control unit 104 can furthermore define time sequences for the functions mentioned above and perform other control or sequence functions for the non-volatile memory 102.

The control unit 104 is configured to carry out a changeover from a first programming mode for the non-volatile memory 102 to a second programming mode on the basis of a control signal. A control signal can be understood herein to mean either a predetermined information item or data value, upon the occurrence of which in a register, for example, the programming mode is changed over, or any other type of suitable signals. In one embodiment, the control unit 104 is configured to carry out, in the first programming mode, repeated programming operations for programming a data value into a memory cell by a procedure in which, for example, after each programming pulse, the applied charge or a measured value indicating the applied charge is detected and, on the basis thereof, one or a plurality of repetitions of the programming pulse is or are carried out. After the changeover to the second programming mode, in this embodiment, only a single programming pulse is applied, independently of whether or not the corresponding standard data retention times are achieved for all the programmed memory cells with this single programming pulse.

In one embodiment, in the second programming mode, checking of the applied charge is not carried out. Likewise, in one embodiment, further programming steps which are carried out or are carried out in part in the first programming mode are not carried out at all. Since the data are programmed or written sequentially, as a result data can be programmed into the non-volatile memory 102 in the second programming mode significantly faster or a data programming rate or data writing rate can be increased, since, in contrast to the first programming mode, the programming-in of the data is ended after the first programming pulse and it is not necessary to wait for the subsequent programming or reprogramming of memory cells, which increases the programming time for data by a corresponding factor in comparison with writing with a single programming pulse.

The above procedure is particularly advantageous for example when an exceptional state or emergency state occurs in which an external supply with electrical energy for an assembly or other units on which the non-volatile memory is arranged is no longer available. In such a case, it is usually necessary or desirable to store specific data with a specific data volume prior to total failure on the non-volatile memory 102. Such cases can occur for example during a crash between one object and another object, for example during a crash between two means of transport such as, for example, two automobile vehicles, in which the supply battery of the means of transport is torn away and an energy supply for the non-volatile memory 102 is therefore provided only for a short remaining time by internal capacitors or capacitances on the assembly. In such a case, for technical and/or legal insurance reasons, it is necessary or desirable to store specific data concerning the behavior of the means of transport, for example the triggering of an airbag, on the non-volatile memory 102, in order to allow said data to be able to be read out from the non-volatile memory 102 and analyzed or assessed after the crash. Other corresponding emergency states can occur, for example, if a data processing device or computer is dropped from a great height, and the battery is torn away or destroyed in the process.

Programming with only one programming pulse in this case enables for virtually all memory cells a minimum data retention time that suffices to ensure a read-out of the data at least over a specific time period. As a result, upon the occurrence of an emergency situation such as, for example, the failure of the energy supply as a result of a crash, it is possible to effect fast programming of the data in the second programming mode, in which, however, a read-out of the programmed data from the memory cells is ensured at least over a specific time period. Consequently, in the emergency situation it is ensured that specific data can be written and subsequently read out. Since, after an emergency situation, the data are read out for analysis or evaluation, for example, typically shortly after the emergency situation, the writing of the data in the second programming mode and the reduced data retention time associated therewith are completely sufficient to ensure the data integrity for the data that are intended to be written upon the occurrence of the emergency situation.

The procedure described above also makes it possible, in particular, to use an energy-saving programming pulse such as a Fowler-Nordheim programming pulse, for example, in which, in the first programming mode, it is typically necessary to reprogram memory cells once or a plurality of times in order to achieve a standard data retention time and a long programming duration of up to 15 ms thus occurs, and after, upon the occurrence of the emergency state, to change to the second programming mode, in which only a single programming pulse is carried out per memory cell, as a result of which, although the data retention time can be reduced or the standard data retention time can no longer be attained, significantly faster programming of a corresponding quantity of data is possible within the time window that results from the lack of an external energy supply and the changeover to the internal energy supply with low capacitance. This makes it possible, for example, for applications such as airbag applications, for example, in which fast programming is necessary in emergency situations, also to use programming methods such as a Fowler-Nordheim programming method, for example, which save more energy but require a longer programming time or repeated reprogramming of individual memory cells in the "normal" programming mode in order to fulfill a standard data retention time.

In other exemplary embodiments, instead of programming with a single programming pulse, programming with more than one programming pulse can be effected in the second programming mode, wherein the number of programming pulses in the second programming mode is lower than the number of programming pulses in the first programming mode.

Furthermore, in one embodiment, in the second programming mode, programming can be effected in such a way that the voltage applied for programming is different than the voltage applied during programming in the first programming mode. Thus, faster programming can likewise be achieved by increasing the programming voltage. In one embodiment, increasing the programming voltage can be combined with reducing the number of programming pulses. By way of example, in one embodiment, programming with a single programming pulse and an increased programming voltage can be effected in the second programming mode.

In one embodiment, upon occurrence of the control signal, an erase operation (ERASE) for erasing memory cells of the memory, for example for erasing a page, is terminated, wherein the erase operation is not automatically started again in the second programming mode. An erase operation is necessary in the case of non-volatile memories comprising field effect transistors as data memories, such as flash memories, for example, in order to erase an existing programming and to be able to carry out a renewed programming. In the case of flash memories, the erase operation is carried out page by page (or block by block/sector by sector), that is to say that, during an erase operation, an entire page is always erased or is brought to the erased state. An immediate termination of this erase operation makes it possible, firstly, to avoid a consumption of electrical energy for operations that are not absolutely necessary in the emergency state, and, secondly, for the data to be written faster. In contrast to known methods, in this case the erase operation is not interrupted, but rather terminated, that is to say that there is no attempt to resume the erase operation. This has the advantage that in the second programming mode between two jobs for programming data the control unit 104 does not waste time and energy in starting the erase operation again, rather a time and energy optimization with regard to the programming of the data to be programmed is carried out in the second programming mode. In one embodiment, the programming status, e.g. erased or programmed, can be stored in a special memory area, for example a special status page in the non-erased sector, as a result of which the termination of the erase operation is not critical. In another embodiment, in which such recording in non-erased sectors does not take place, it can also be accepted that, as a result of the termination of the erase operation, memory cells can have a state that is designated as invalid, i.e. in which no information is stored about whether the memory cell or a memory cell area is erased or programmed.

In accordance with one embodiment, the data that are programmed in during the second programming mode are data that relate to an emergency situation, for example data in connection with a crash of a vehicle, such as airbag-related data, for example. In one embodiment, exclusively data that relate to an emergency situation are programmed.

It is only if it emerges, for example, that the emergency state was mistakenly assumed, for example if, rather than a crash, only slight bumping against an edge of the curb took place, or if only a momentary interruption of the energy supply took place, that, in one embodiment, the terminated erase operation is repeated in order to ensure that the non-volatile memory 102 has no memory cells having an irregular or illegal state.

Likewise, in one embodiment the data programmed during the second programming mode are marked as invalid since, on account of the charge not having been checked, there is no certainty that the programmed data can be retained over the standard data retention time, which can be 5 years, for example.

In one embodiment, the control signal for changeover is carried out on the basis of measurement variables or measurement signals of sensors. In the embodiment described above, wherein a changeover is effected in the case of a crash, said measurement variables can be, for example, the same measured values or measurement variables that are taken into account in the decision concerning the triggering of an airbag. Such measurement variables comprise, for example, measurement variables of acceleration sensors, force sensors, etc. In this case, the control unit 104 can for example likewise perform the functions for controlling the airbag. That is to say that if the control unit 104 determines that an airbag is intended to be triggered, the control signal for changing over from the first to the second programming mode is likewise generated on the basis of the triggering.

Figure 2:
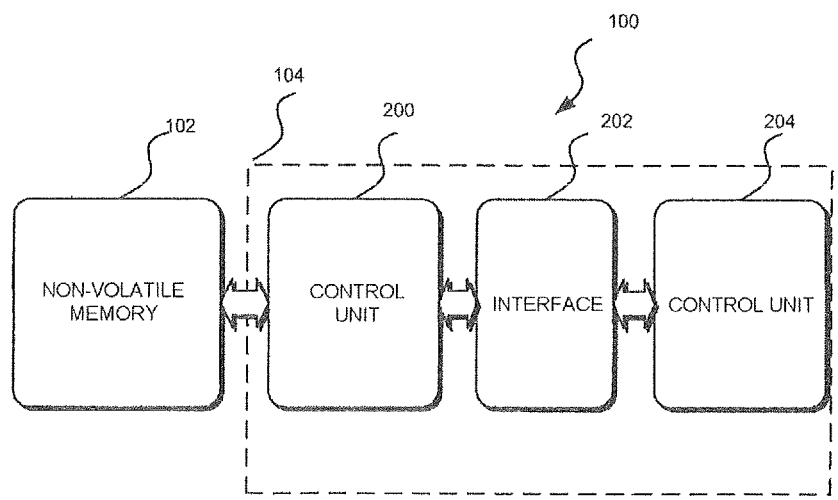
FIG. 2 shows a schematic illustration of a device in accordance with one embodiment.

Referring to FIG. 2, an explanation will now be given about an embodiment in which the control unit 104 comprises a plurality of individual control units 200 and 204, that are connected via an interface 202.

In the embodiment shown in FIG. 2, the control unit 200 is coupled to the non-volatile memory 102 in order to carry out the corresponding control of the memory functions such as, for example, the selection of memory cells, the generation of the programming or erasing voltages, the read-out of data, etc. One output of the control unit 200 is coupled to the interface 202. The interface 202 is furthermore coupled to the control unit 204 in order to receive commands or information from the control unit 204. The controller 204 can be a microcontroller, for example, that can perform one or a plurality of functions. The control unit 204 can be an airbag control unit, for example, that carries out functions for controlling and monitoring an airbag.

During operation, the controller 204 transmits commands or information to the interface 202. In one embodiment, the interface 202 implements interpreter functions in order to convert the commands or information received from the controller 204 into commands or information that can be interpreted by the control unit 200. The functions that are performed by the interface 202 can be programmed for example by means of software or in some other way. Likewise, the control units 200 and 204 can be programmable by means of software or in some other way.

The provision of the interface 202 increases the flexibility and makes it possible that the control unit 204 can be replaced by other types of control units 204 without the need to alter command functions in the control unit 200. It is then merely necessary for adaptation in the interface 202. The control unit 204 can be, for example, a general microcontroller or a microcontroller specialized for specific tasks, such as an airbag controller, for example. The control unit 200 can furthermore likewise be embodied as a controller or as a programmable interface, etc.

In one embodiment, the control signal is transmitted in the control unit directly from the controller 204 to the control unit 200. This can be effected, for example, in such a way that a predetermined information item or data value is generated by the control unit 204 and is written via the interface 202 into one or a plurality of registers of the control unit 200. In one embodiment, a corresponding register can be provided for each memory module, for example each flash module. The presence of the predetermined information in the register is continuously checked by the control unit 200 and a changeover from the first mode to the second mode is carried out when the predetermined value is present in the register. In one embodiment, direct communication of software running on the control unit 204 with the control unit 200 is made possible. Furthermore, in one embodiment, special commands can be provided that are transmitted from the control unit 204 to the interface 202 in order to bring about the changeover from the first to the second programming mode.

Figure 3:
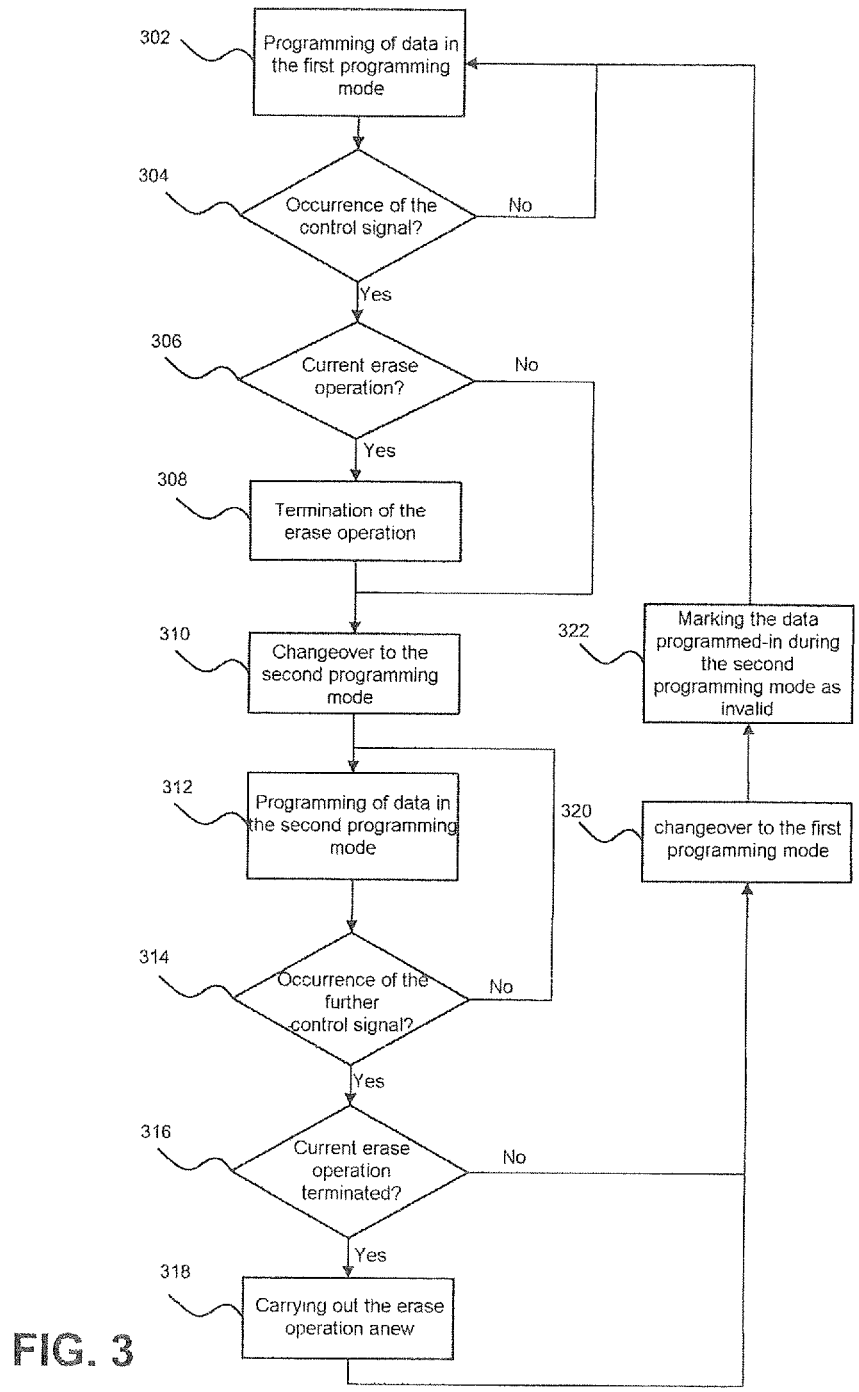
FIG. 3 shows a flowchart in accordance with one embodiment.

A flowchart 300 in accordance with one embodiment of the present application will now be described with reference to FIG. 3. While the exemplary method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

A step 302 involves firstly carrying out programming of data in the first programming mode, which constitutes a "normal" programming mode. At 304 a check is made to determine whether the control signal for changeover to the second programming mode has occurred. If this is not the case, programming in the first programming mode is continued in step 302. If the control signal has occurred (yes at 304), the method proceeds, and at 306 a decision is taken as to whether a current erase operation, for example for a sector of the non-volatile memory 102 is present. If an erase operation is present, the erase operation is terminated at 308 and a changeover to the second programming mode is carried out at 310. If a current erase operation is not present in 306, then the method jumps directly to step 310 and the changeover to the second programming mode is carried out. After the changeover, data such as crash data, for example, are programmed in the second programming mode at 312. After the data had been programmed at 312, at 314 a check is made to determine whether a further control signal is present. In this case, the further control signal constitutes a control signal that indicates, for example, that an emergency situation was assumed mistakenly or erroneously. If this is not the case, the system remains in the second programming mode.

However, if the further control signal occurs (yes at 314), then at 316 it is determined whether a termination of the erase operation took place at 308. If such an erase operation was terminated (yes at 316), the erase operation is carried out anew at 318, a changeover to the first programming mode is effected at 320 and the data programmed in during the second programming mode are marked as invalid. If it is determined at 316 that a current erase operation was not terminated, the method jumps directly to step 320 and a changeover to the first programming mode is effected and, at 322, the data programmed in during the second programming mode are declared to be invalid.

It should be mentioned at this juncture that many modifications of the sequence illustrated are possible, including an interchange of orders or an insertion of additional steps. By way of example, after the changeover to the first programming mode at 320, data values of the data written to memory cells in the second programming mode can be programmed anew into other memory areas, for example into other pages, after the changeover to the first programming mode. These data then have a sufficient standard data retention time since they are checked and, if appropriate, reprogrammed.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method comprising:
    programming data into a non-volatile memory with a first programming mode;
    generating a control signal; and
    changing over the data programming to a second, different programming mode in response to the generated control signal,
    wherein, in the first programming mode, the programming of the memory cells is checked and, if appropriate, individual memory cells are reprogrammed, and wherein, in the second programming mode, programming is effected without checking and reprogramming; and
    wherein programming in the second programming mode has a shorter programming time and a shorter data retention time in comparison with the first programming mode.

2. a method comprising:
    programming data into a non-volatile memory with a first programming mode;
    generating a control signal; and
    changing over the data programming to a second, different programming mode in response to the generated control signal,
    wherein the first programming mode is a programming mode in which, for programming a data value into a memory cell, a programming pulse can be repeated one or a plurality of times, and wherein the second programming mode is a programming mode in which, for programming a data value, a programming pulse is applied only once; and
    wherein programming in the second programming mode has a shorter programming time and a shorter data retention time in comparison with the first programming mode.

3. The method of claim 1, wherein a memory cell of the non-volatile memory has a field effect transistor with a floating gate for storing information.

4. The method of claim 3, wherein a programming operation for programming a data value into a memory cell comprises Fowler-Nordheim tunneling.

5. The method of claim 3, wherein the non-volatile memory is a flash memory.

6. The method of claim 5, wherein an erase operation for erasing memory cells of the memory terminates upon the occurrence of the control signal, wherein the erase operation is not started in the second programming mode.

7. The method of claim 1, wherein the method furthermore comprises:
    monitoring the output signals of at least one sensor element;
    determining whether a first state is present, depending on the monitored output signals; and
    generating the control signal on the basis of the determination that the first state is present.

8. The method of claim 7, wherein the first state indicates a crash of a means of transport.

9. A method comprising:
    programming data into a non-volatile memory with a first programming mode;
    generating a control signal;
    changing over to the data programming to a second, different programming mode in response to the generated control signal;
    generating a further control signal;
    changing over to the first programming mode in response to the generated further control signal; and
    marking the data writing to memory cells in the first programming mode as invalidly written data depending on the occurrence of the further control signal.

10. The method of claim 9, wherein the data values of the data written to memory cells in the second programming mode are programmed anew after the changeover to the first programming mode.

11. The method of claim 9, wherein an erase operation for erasing memory cells of the memory terminates on the basis of the occurrence of the control signal, and wherein the interrupted erase operation for erasing memory cells is carried out anew on the basis of the occurrence of the further control signal.

12. A device, comprising:
    a non-volatile memory; and
    a control unit configured to control a programming mode associated with the non-volatile memory, and configured to change over a programming of data of the non-volatile memory from a first programming mode to a second, different programming mode based on an occurrence of a control signal,
    wherein the device is configured to carry out, in the first programming mode, a checking of the preprogramming of the memory cells and, if appropriate, reprogramming of individual memory cells and to carry out, in the second programming mode, a programming without checking and reprogramming; and
    wherein programming in the second programming mode has a shorter programming time and a shorter data retention time in comparison with the first programming mode.

13. A device, comprising:
    a non-volatile memory; and
    a control unit configured to control a programming mode associated with the non-volatile memory, and configured to change over a programming of data of the non-volatile memory from a first programming mode to a second, different programming mode based on an occurrence of a control signal,
    wherein the first programming mode is a programming mode in which, for programming a data vale into a memory cell, a programming pulse is selectively repeated one or a plurality of times, and wherein the second programming mode is a programming mode in which, for programming a data value, a programming pulse is applied only once; and
    wherein programming in the second programming mode has a shorter programming time and a shorter data retention time in comparison with the first programming mode.

14. The device of claim 12, wherein a memory cell of the non-volatile memory comprises a transistor with a floating gate for storing information.

15. The device of claim 14, wherein the non-volatile memory is configured so that the memory cells of the non-volatile memory are programmed by Fowler-Nordheim tunneling.

16. The device of claim 14, wherein the non-volatile memory is a flash memory.

17. The device of claim 12, wherein the control unit is configured to terminate an erase operation for erasing memory cells of the non-volatile memory upon the occurrence of the control signal, without the erase operation being started again during the second programming mode.

18. The device of claim 12, wherein the control unit is furthermore configured to generate the control signal depending on output signals of at least one sensor element.

19. The device of claim 18, wherein the control unit is configured to generate the control signal upon identification of a crash of a means of transport.

20. A device, comprising:
- a non-volatile memory; and
- a control unit configured to control a programming mode associated with the non-volatile memory, and configured to change over a programming of data of the non-volatile memory from a first programming mode to a second, different programming mode based on a occurrence of a control signal,
- wherein the unit is further configured to generate a further control signal and to change over to the first programming mode based on an occurrence of the further control signal and to mark the data written to memory cells in the first programming mode as invalidly written data.

21. The device of claim 20, wherein the control unit is configured to program anew data values of the data written to memory cells in the second programming mode after the changeover to the first programming mode.

22. The device of claim 20, wherein the control unit is configured to terminate an erase operation for erasing memory cells of the non-volatile memory based on an occurrence of one control signal and to carry out anew the interrupted erase operation for erasing memory cells based on an occurrence of the further control signal.

23. An airbag system comprising: an apparatus configured to trigger an airbag; and a device, comprising: a non-volatile memory; and a control unit configured to control a programming mode associated with the non-volatile memory, and configured to change over a programming of data of the non-volatile memory from a first programming mode to a second, different programming mode based on an occurrence of a control signal associated with a trigger of the airbag, wherein programming in the second programming mode has a shorter programming time and a shorter data retention time in comparison with the first programming mode.

* * * * *

UNITED STATES PATENT AND TRADEMARK OFFICE
CERTIFICATE OF CORRECTION

PATENT NO.       : 8,913,435 B2                                Page 1 of 1
APPLICATION NO.  : 13/233292
DATED            : December 16, 2014
INVENTOR(S)      : Ulrich Backhausen et al.

It is certified that error appears in the above-identified patent and that said Letters Patent is hereby corrected as shown below:

In the Claims

Column 9, Claim 2, Line 17 Please replace "a method comprising" with --A̲ method comprising--

Column 10, Claim 13, Line 41 Please replace "... for programming a data vale into ..." with --... for programming a val̲u̲e into ...--

Signed and Sealed this
Thirty-first Day of March, 2015

Michelle K. Lee
*Director of the United States Patent and Trademark Office*